United States Patent
Ng et al.

(10) Patent No.: US 8,336,757 B2
(45) Date of Patent: Dec. 25, 2012

(54) APPARATUS FOR TRANSPORTING SUBSTRATES FOR BONDING

(75) Inventors: Man Chung Ng, Kwai Chung (HK);
Wing Fai Lam, Kwai Chung (HK);
Chung Wai Ku, Kwai Chung (HK)

(73) Assignee: ASM Assembly Automation Ltd, Hong Kong (HK)

( * ) Notice: Subject to any disclaimer, the term of this patent is extended or adjusted under 35 U.S.C. 154(b) by 0 days.

(21) Appl. No.: 12/983,948

(22) Filed: Jan. 4, 2011

(65) Prior Publication Data
US 2012/0168489 A1 Jul. 5, 2012

(51) Int. Cl.
*B23K 37/04* (2006.01)
(52) U.S. Cl. ........ 228/49.1; 228/4.1; 228/4.5; 228/47.1; 29/740; 29/832; 414/788; 414/798.2
(58) Field of Classification Search ............... 228/4.5, 228/49.1, 180.5, 4.1, 47.1; 414/788, 798.2; 29/740, 832
See application file for complete search history.

(56) References Cited

U.S. PATENT DOCUMENTS

| | | | | |
|---|---|---|---|---|
| 7,032,304 | B2* | 4/2006 | Gieskes | 29/832 |
| 7,200,922 | B2* | 4/2007 | Kabeshita et al. | 29/740 |
| 7,654,436 | B2* | 2/2010 | Ho et al. | 228/180.5 |
| 7,655,108 | B2* | 2/2010 | Nakanishi | 156/297 |

FOREIGN PATENT DOCUMENTS
JP 2006-156444 6/2006
* cited by examiner

*Primary Examiner* — Devang R Patel
(74) *Attorney, Agent, or Firm* — Ostrolenk Faber LLP

(57) ABSTRACT

A bonding apparatus for conducting bonding on substrates comprises a first substrate holding device for clamping a first substrate during bonding and a second substrate holding device for clamping a second substrate during bonding. Each substrate holding device is operative to move sequentially between its respective onloading position for receiving substrates, bonding position whereat substrates are bonded and offloading position whereat bonded substrates are removed from the substrate holding device. A first actuator is operative to drive the first substrate holding device along a first feeding path from its onloading position to its bonding position and from its offloading position to its onloading position along a first return path. A second actuator is operative to drive the second substrate holding device along a second feeding path from its onloading position to its bonding position and from its offloading position to its onloading position along a second return path.

20 Claims, 5 Drawing Sheets

APPARATUS FOR TRANSPORTING SUBSTRATES FOR BONDING

FIELD OF THE INVENTION

The invention relates to an apparatus for transporting substrates, and in particular, to an apparatus for transporting substrates for bonding applications.

BACKGROUND AND PRIOR ART

In wire or die bonders used for the assembly of semiconductor packages, substrates for mounting electronic devices are transported and indexed along a conveyor of a substrate transportation apparatus for pattern recognition, alignment of the substrate and bonding of wires or dice onto the substrates. One conventional way of transporting a substrate is by supporting it using several indexers along a guide rail. A substrate transportation apparatus 100 as illustrated in FIGS. 1A to 1C utilizes a conventional motion sequence which transfers a substrate 102 between two indexing devices. An input indexer 106 and an output indexer 108 are aligned along a guide rail 104 to relay the substrate 102 linearly. The substrate 102 is transferred from the input indexer 106 to the output indexer 108 approximately midway between the input end and the output end of the guide rail 104.

FIG. 1A shows a window clamp 110 which is located at a bonding position along the guide rail 104. Both the input indexer 106 and the window clamp 110 are closed against the guide rail 104 to clamp against the substrate 102 which has been loaded at the input end of the guide rail 104. The output indexer 108 is located downstream along the guide rail 104 and is kept open in a standby position to receive the substrate 102. When the substrate 102 is held at the window clamp 110, die bonding is carried out at a die bonding position. After the substrate 102 has been further indexed and reaches the output indexer 108, the output indexer 108 clamps onto the substrate 102 as shown in FIG. 1B. At the same time, the input indexer 106 opens to release the substrate 102 which is now supported by the window clamp 110 and the output indexer 108. The output indexer 108 continues to index the substrate 102 towards the end of the guide rail 104 for offloading a bonded substrate 102 as in FIG. 1C, while the input indexer 106 is open and stands by to receive another substrate 102 for indexing along the guide rail 104.

Such a conventional indexing apparatus requires the opening and closing of the input and output indexers 106, 108 and the window clamp 110. Time is wasted for these additional motions and the machine's throughput is affected. Furthermore, transferring the substrate 102 from the input indexer 106 to the output indexer 108 may introduce positional errors to the substrate 102 since the transfer requires each input indexer 106 and output indexer 108 to open and close for releasing or clamping onto the substrate 102 as explained above. Therefore, re-adjustment of the substrate 102 to correct any positional errors that are introduced is necessary after each transfer. Placement compensation by pre-inspection is also required at the die bonding position along the guide rail 104.

One prior art assembly implementing multiple indexers for the transportation of a substrate is described in Japanese Publication No. 2006-156444 entitled "Assembly Device And Transport Device/Method of Workpiece". The assembly uses two pick-and-place transporting arms for transporting substrates between workstations. Thus, this assembly encounters the above problems and disadvantages since transfer of a substrate between indexers is required. It is thus desirable to devise a substrate transportation apparatus for transporting a substrate effectively without introducing positional errors during the transportation process.

SUMMARY OF THE INVENTION

It is thus an object of the invention to seek to provide an apparatus for transporting substrates from one position to another for bonding operations with increased throughput as compared to a conventional dual-indexer apparatus.

Accordingly, the invention provides a bonding apparatus for conducting bonding on substrates, comprising: a first substrate holding device for clamping a first substrate during bonding and a second substrate holding device for clamping a second substrate during bonding, each substrate holding device being operative to move sequentially between its respective onloading position for receiving substrates, bonding position whereat substrates are bonded and offloading position whereat bonded substrates are removed from the substrate holding device; a first actuator operative to drive the first substrate holding device along a first feeding path from its onloading position to its bonding position and from its offloading position to its onloading position along a first return path; and a second actuator operative to drive the second substrate holding device along a second feeding path from its onloading position to its bonding position and from its offloading position to its onloading position along a second return path.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiments of the invention when considered with the accompanying drawings, in which.

DETAILED DESCRIPTION OF THE PREFERRED EMBODIMENTS OF THE INVENTION

The preferred embodiments of the present invention will be described hereinafter with reference to the accompanying drawings.

Figure 1:
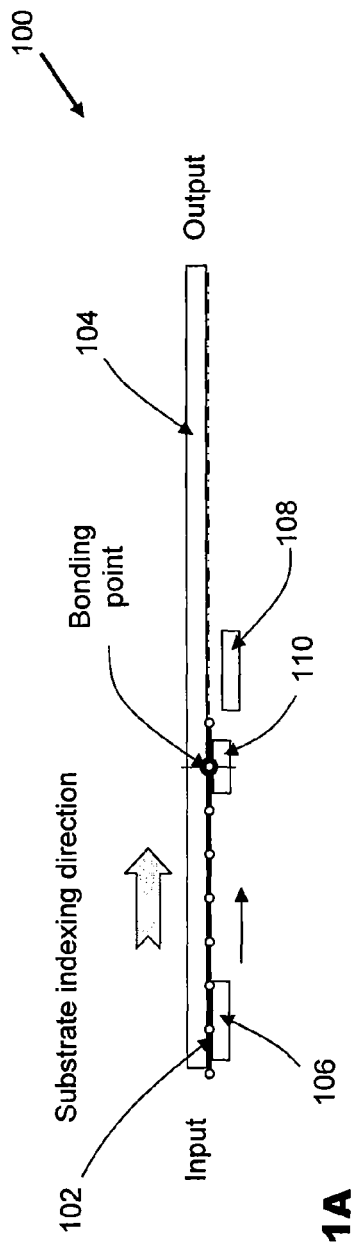
FIGS. 1A to 1C are schematic plan views of a conventional motion sequence for transferring a substrate between two indexing devices along a guide rail.
Figure 1:
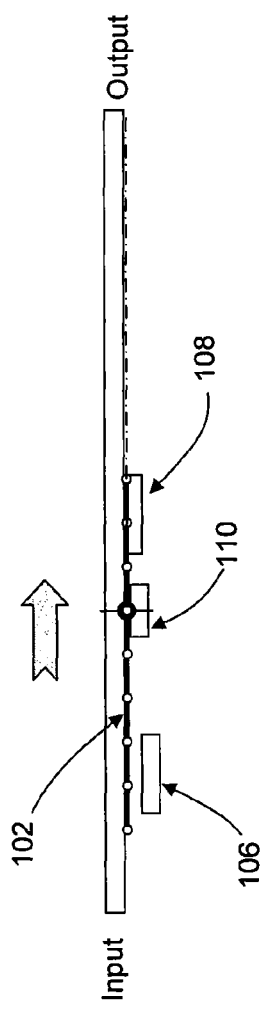
Figure 1:
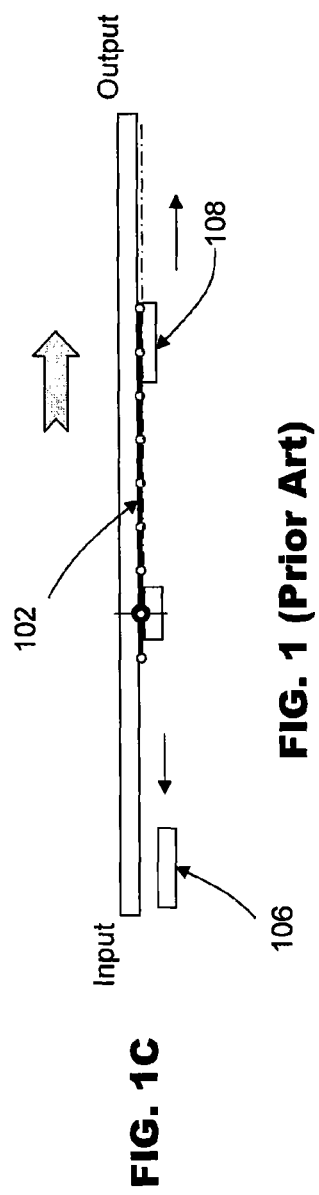
Figure 2:
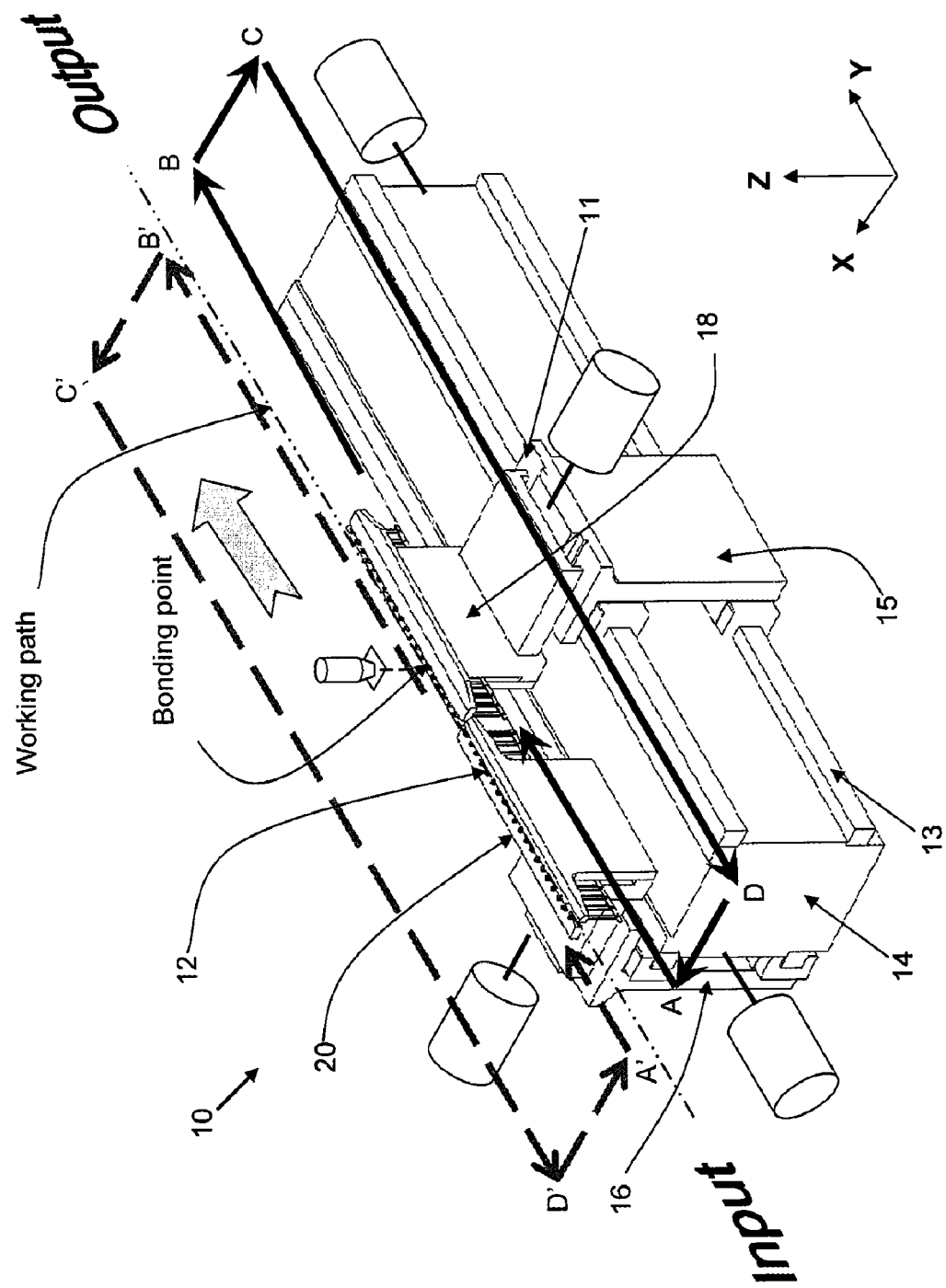
FIG. 2 is an isometric view of a substrate transportation apparatus according to a first preferred embodiment of the invention.

FIG. 2 is an isometric view of a substrate transportation apparatus 10 according to a first preferred embodiment of the invention. Each substrate 12 may be transported individually or multiple individual substrates may be mounted onto a carrier and transported together. The substrate transportation apparatus 10 comprises a linear guide rail 14 on a first side of the apparatus 10 with an input end and an opposite output end. There is another linear guide rail (see FIG. 3) located on a second side of the apparatus 10 opposite to the first side about a center line passing through a bonding position of the apparatus, where semiconductor dice are bonded to the substrates 12 with a die bonder.

A first indexing device 15 is mounted on the first side of the apparatus 10 while a second indexing device 16 is mounted along the second side of the apparatus 10. Each of the first and second indexing devices 15, 16 includes X-Y positioning tables with X and Y carriages 11, 13 driven by separate actuators. The first indexing device 15 is illustrated with an X carriage 11 and a Y carriage 13, such that the first and second indexing devices 15, 16 are movable independently of each other.

The first and second indexing devices 15, 16 are coupled to and support first and second substrate holding devices 18, 20 respectively which are movable sequentially along feeding paths from the input end (comprising an onloading region) to the output end of the guide rail 14 (comprising an offloading region). The first and second substrate holding devices 18, 20 each clamps a substrate 12 during bonding of the substrate 12, and return to the substrate onloading region along separate return paths which are spaced from the feeding paths. Accordingly, each of the substrate holding devices 18, 20 is movable along respective first and second cyclical working paths ABCD, A'B'C'D', each complete cyclical working path being in the shape of a quadrilateral. The cyclical working paths mirror each other about the bonding position.

In particular, each return path CD, C'D' is horizontally spaced from a feeding path AB, A'B' on a horizontal plane so that movement of one substrate holding device 18, 20 does not obstruct the other along the return path CD and C'D'. Positions on the feeding path AB of the first substrate holding device 18 may overlap with positions on the feeding path A'B' of the second substrate holding device 20. The loading time of each of the substrate holding devices 18, 20 with a substrate 12 should be staggered. Therefore, substrates can be indexed continuously and the idle time of each indexing device 15, 16 is reduced.

In the preferred embodiment of the invention that is illustrated, each substrate holding device 18, 20 is arranged to clamp one substrate 12 in a vertical orientation. The substrate holding devices 18, 20 may also be configured to carry substrates 12 horizontally. The substrate holding devices 18, 20 hold and clamp the substrates 12 to feed the substrates 12 from the input end of the guide rail 14 to the output end thereof along AB and A'B' by moving the substrates 12 through onloading, dispensing, die bonding and offloading regions without having to transfer the substrates 12 from one indexer to another indexer like in the conventional substrate transportation apparatus 100 described above. The onloading, die bonding and offloading positions or regions are located in a straight line such that the linear guide rails 14 are located on opposite sides of the said straight line. Thus, it is not necessary to allocate additional time for the opening and closing of indexers and window clamps during substrate transfer or for pattern recognition delay since there is no need to re-align the substrates 12 during feeding.

After the substrate 12 has been offloaded at the output end of the guide rail 14, each substrate holding device 18, 20 returns to the input end of the guide rail 14 via the return pathways CD/C'D'. Next, the first and second indexing devices 15, 16 will re-position the substrate holding devices 18, 20 to onloading positions A and A' and repeat the process of feeding further substrates 12 from the input end to the output end of the guide rail 14.

Figure 3:
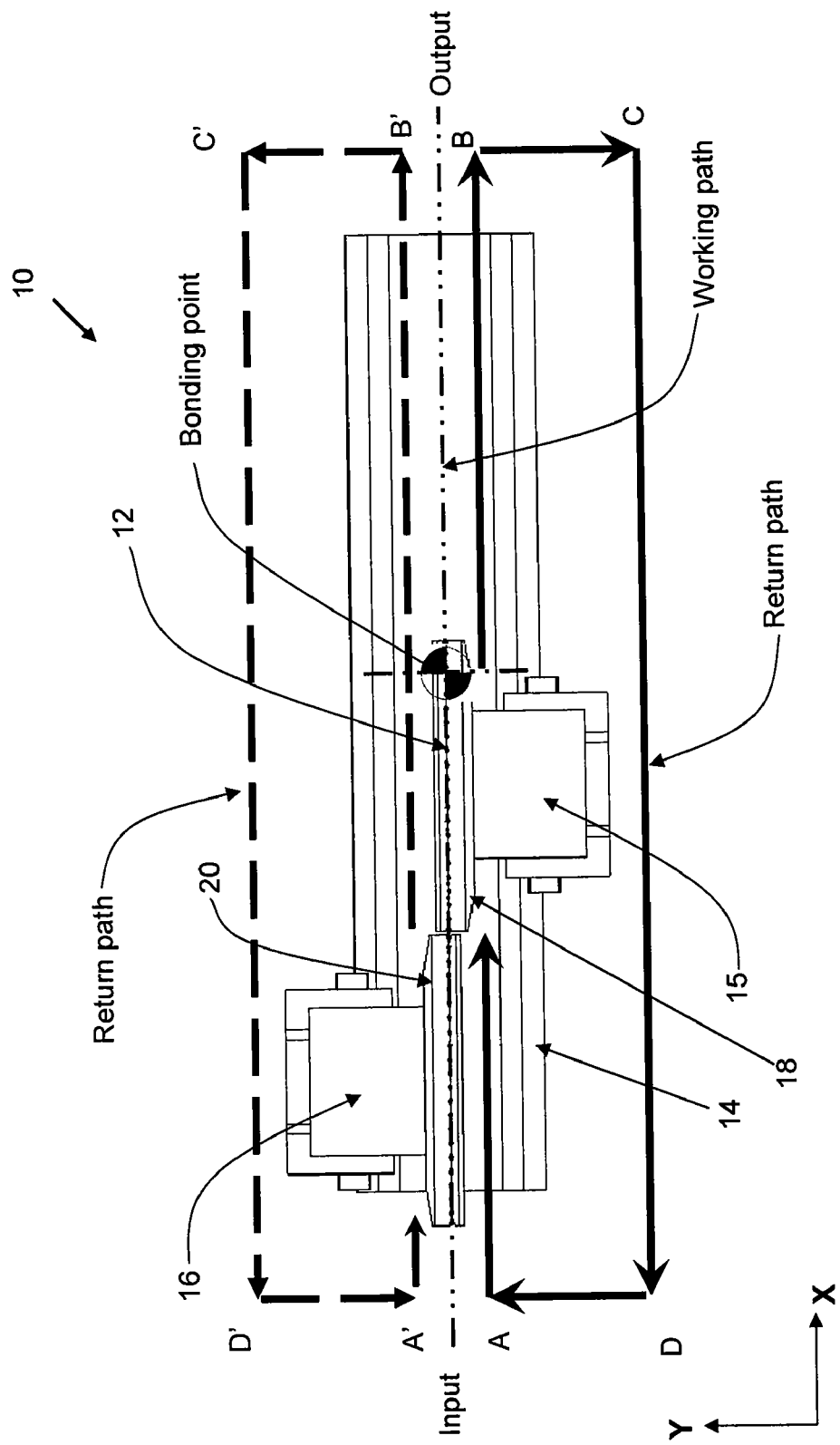
FIG. 3 is a plan view of the substrate transportation apparatus of FIG. 2 illustrating dual working paths of two indexing devices of the apparatus.

FIG. 3 is a plan view of the substrate transportation apparatus 10 of FIG. 2 illustrating dual working paths of two indexing devices 15, 16 of the apparatus 10. The first substrate holding device 18 moves along a first cyclical working path ABCD while the second substrate holding device 20 moves through another cyclical working path A'B'C'D'. The first substrate holding device 18 holds and clamps onto a substrate 12 and feeds the substrate 12 from the input end of the guide rail 14 to the output end thereof along AB in the X-direction without having to transfer the substrate 12 to another indexer. The second substrate holding device 20 is spaced from the first substrate holding device 18 and it holds and clamps another substrate 12 and transports the substrate 12 from the input end of the guide rail 14 to the output end thereof along A'B'. Both the substrate holding devices 18, 20 position substrates 12 for bonding either at the same bonding position or at separate bonding positions. The first and second indexing devices 15, 16 offload substrates 12 after die bonding at the same or at separate offloading positions B and B' and then return to the input end of the guide rail 14 at the same or at separate onloading positions A and A' respectively by moving the substrate holding devices 18, 20 along CD/C'D' back towards D and D' and then to A and A'.

The first and second indexing devices 15, 16 transfer substrates 12 alternately for bonding. When the first indexing device 15 is engaged in offloading one substrate 12 and loading another substrate 12, yet another substrate 12 is being bonded. Therefore, by having at least two indexing devices in this configuration, any idle time of each indexing device is much reduced.

Figure 4:
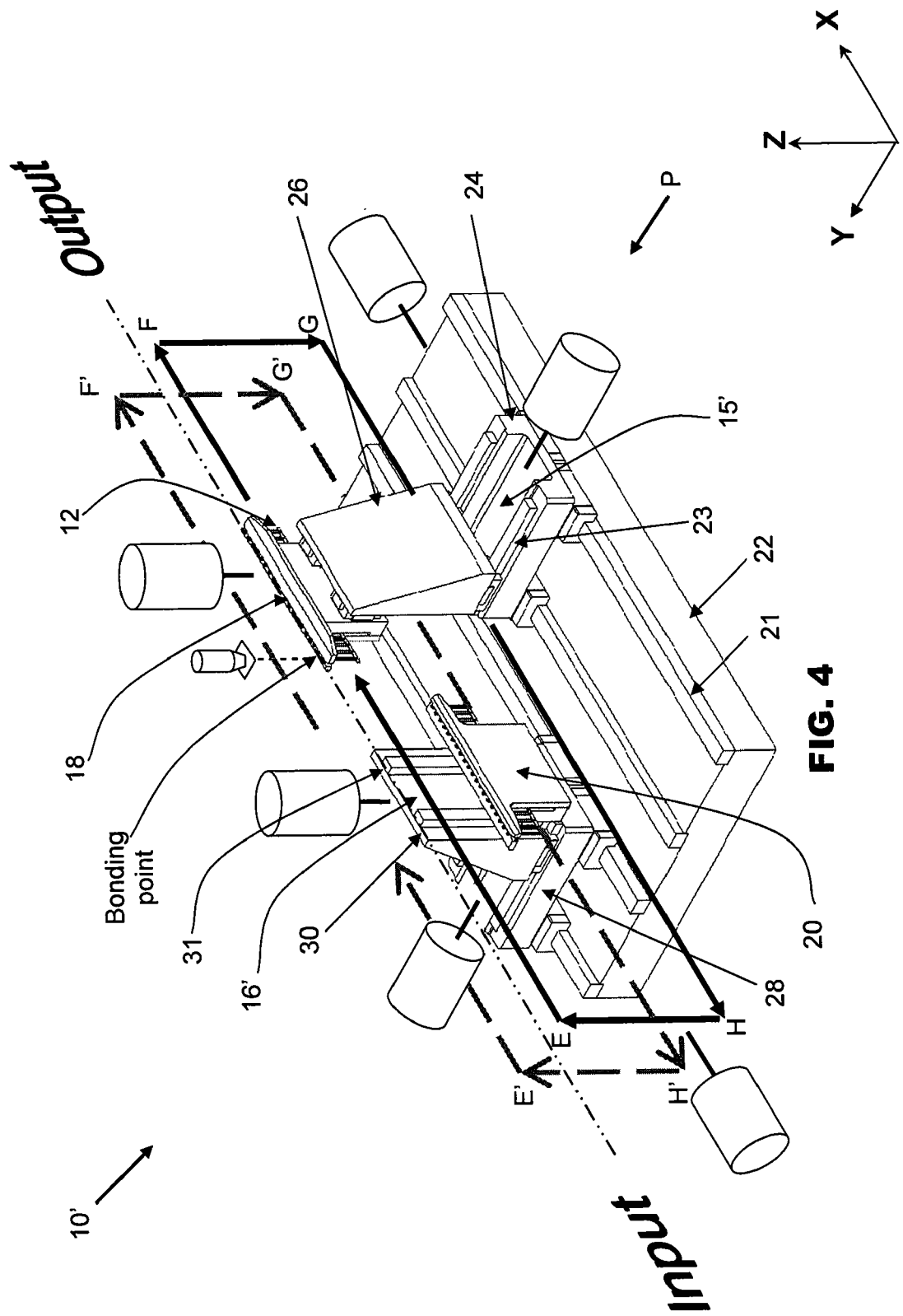
FIG. 4 is an isometric view of a substrate transportation apparatus according to a second preferred embodiment of the invention.

FIG. 4 is an isometric view of a substrate transportation apparatus 10' according to a second preferred embodiment of the invention. The substrate transportation apparatus 10' comprises first and second indexing devices 15', 16' mounted on a common base 22. The first and second indexing devices 15', 16' further comprise first and second Y positioning tables 24, 28 and Z positioning tables 26, 30. First and second substrate holding devices 18, 20 are respectively mounted on the first and second indexing devices 15', 16' and are movable according to the movement of the indexing devices 15', 16' along orthogonal XYZ directions on respective positioning tables. Each positioning table comprises carriages which are actuable separately so that the first and second substrate holding devices 18, 20 are transportable along the carriages independently.

In FIG. 4, an X carriage 21 which includes a pair of tracks transports the first substrate holding device 18 along the X-direction while a Y carriage 23, also including a pair of tracks, transports the first substrate holding device 18 along the Y-direction. A Z carriage 31 of the second indexing device 16' is illustrated as having a pair of tracks for transporting the substrate holding device 20 along the Z-direction. The first substrate holding device 18 moves along a first cyclical working path EFGH while the second substrate holding device 20 moves through a second cyclical working path E'F'G'H', both cyclical paths lying on vertical planes. The first cyclical working path EFGH may overlap with the second cyclical working path E'F'G'H'. The loading time of each of the substrate holding devices 18, 20 with a substrate 12 should be staggered. Further, to ensure that there is no obstruction in the movement of the first and second indexing devices 15', 16', the feeding and return paths for both substrate holding devices 18, 20 are at different heights.

Figure 5:
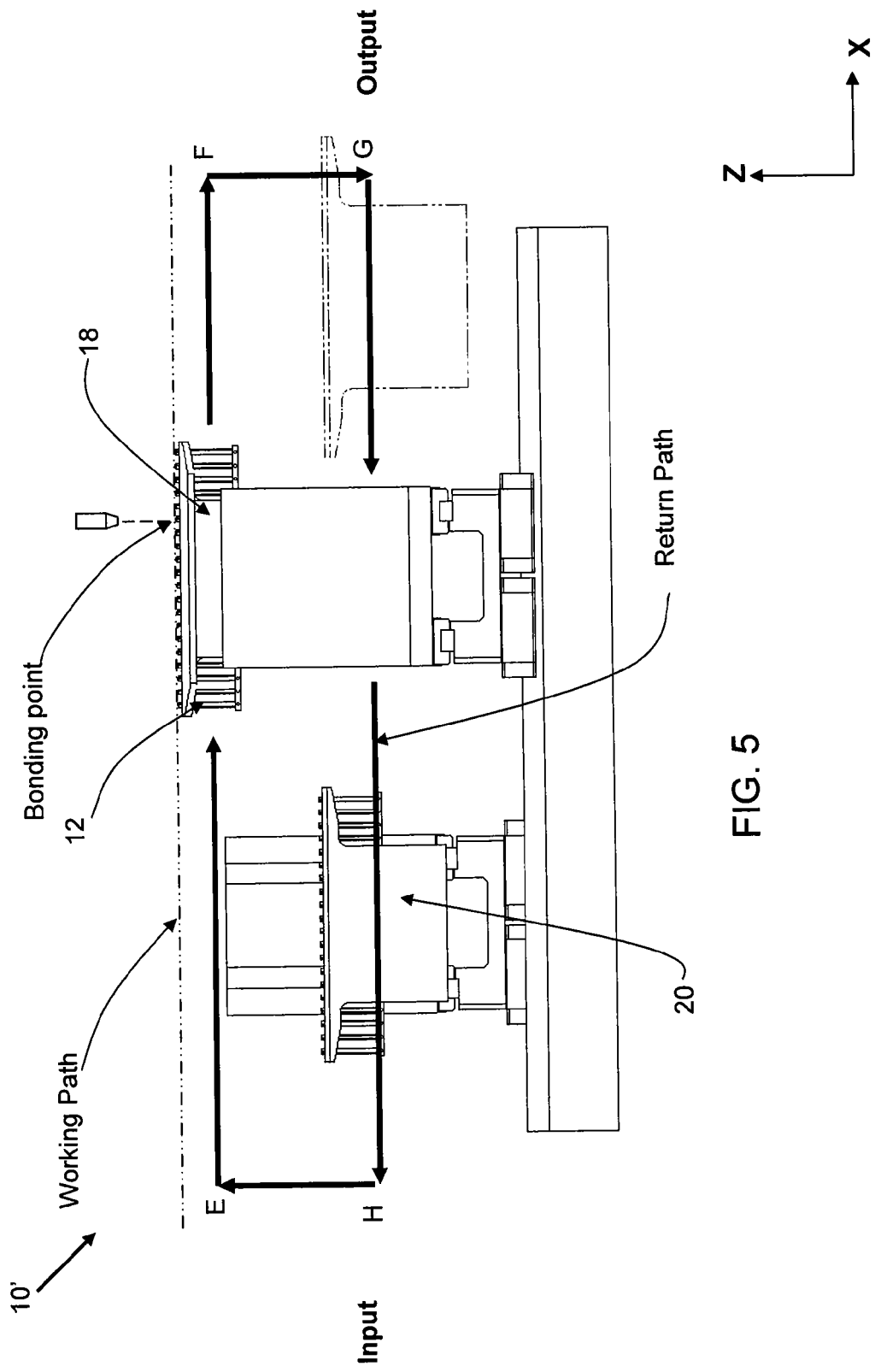
FIG. 5 is a side view of the substrate transportation apparatus from direction P of FIG. 4 illustrating working paths of its two indexing devices.

FIG. 5 is a side view of the substrate transportation apparatus 10' from direction P of FIG. 4 illustrating working paths of its two indexing devices. The first substrate holding device 18 moves along the cyclical working path EFGH to first feed the substrate 12 along the feeding path EF before returning via return path GH. As illustrated, the substrate 12 is held at the die bonding position for die bonding. The first indexing device 15' is spaced from the second indexing device 16' and it is positioned higher than the second indexing device 16'. In this manner, the feeding and return paths for the substrate holding devices 18, 20 are at different heights so that the movement of one indexing device is not obstructed by the other indexing device.

It should be appreciated that the substrate transportation apparatus 10 in accordance with the preferred embodiments of the invention improve the feeding throughput of substrates 12. As substrates 12 are not transferred between indexers during transportation of the substrates from the input end of the guide rail 14 to the output end, positional errors should not arise. Therefore, only one optical system needs to be located at the input end of the guide rail 14 to align a substrate 12 on a substrate holding device 18, 20 before commencement of feeding. Furthermore, it is not necessary to use any window clamps to clamp the substrate 12 at the bonding location since the substrate holding device 18, 20 securely supports the substrates 12 during the entire indexing process. Thus, delay arising from the transfer of substrates 12 from one indexer to another, and from additional pattern recognition for re-alignment of the substrates 12 can be avoided. Machine cycle time for feeding a substrate 12 along the guide rail 14 for bonding operations is significantly decreased. Moreover, by having at least two independently movable indexing devices working simultaneously, idle time of each indexing device is reduced. The overall throughput of the apparatus can be increased as compared to the prior art.

The invention described herein is susceptible to variations, modifications and/or addition other than those specifically described and it is to be understood that the invention includes all such variations, modifications and/or additions which fall within the spirit and scope of the above description.

The invention claimed is:

1. A bonding apparatus for conducting bonding on substrates, the bonding apparatus comprising:
    a first substrate holding device for clamping a first substrate during bonding and a second substrate holding device for clamping a second substrate during bonding, each substrate holding device being operative to move sequentially between its respective onloading position for receiving substrates, bonding position whereat substrates are bonded and offloading position whereat bonded substrates are removed from the substrate holding device;
    a first actuator operative to drive the first substrate holding device along a first feeding path from its on loading position to its bonding position and from its offloading position to its onloading position along a first return path; and
    a second actuator operative to drive the second substrate holding device along a second feeding path from its onloading position to its bonding position and from its offloading position to its onloading position along a second return path;
    wherein the first substrate holding device is mounted onto a first guide rail and the second substrate holding device is mounted onto a second guide rail, and the first and second guide rails are located on opposite sides of the respective bonding position of each of the first and second substrate holding devices, the respective bonding position of each of the first and second substrate holding devices being located between the first feeding path and the second feeding path, both the first feeding path and the second feeding path being linear.

2. The bonding apparatus as claimed in claim 1, wherein the first and second substrate holding devices have the same bonding position.

3. The bonding apparatus as claimed in claim 1, wherein the first and second substrate holding devices have the same onloading and offloading positions.

4. The bonding apparatus as claimed in claim 1, wherein positions of the first and second substrate holding devices traveling along the first and second feeding paths overlap.

5. The bonding apparatus as claimed in claim 4, wherein the first return path is spaced from the first feeding path and the second return path is spaced from the second feeding path.

6. The bonding apparatus as claimed in claim 1, wherein the onloading position, bonding position and offloading position for each substrate holding device are located along a straight line.

7. The bonding apparatus as claimed in claim 6, wherein the first guide rail and the second guide rail are linear, and the first and second linear guide rails extend alongside the respective onloading position, bonding position and offloading position.

8. A bonding apparatus for conducting bonding on substrates, the bonding apparatus comprising:
    a first substrate holding device for clamping a first substrate during bonding and a second substrate holding device for clamping a second substrate during bonding, each substrate holding device being operative to move sequentially between its respective onloading position for receiving substrates, bonding position whereat substrates are bonded and offloading position whereat bonded substrates are removed from the substrate holding device;
    a first actuator operative to drive the first substrate holding device along a first feeding path from its on loading position to its bonding position and from its offloading position to its onloading position along a first return path;
    a second actuator operative to drive the second substrate holding device along a second feeding path from its onloading position to its bonding position and from its offloading position to its onloading position along a second return path;
    wherein the onloading position, bonding position and offloading position for each substrate holding device are located along a straight line;
    the first substrate holding device is mounted onto a first linear guide rail and the second substrate holding device is mounted onto a second linear guide rail, and the first and second linear guide rails extend alongside the respective onloading position, bonding position and offloading position; and
    the first linear guide rail and the second linear guide rail are located on opposite sides of the straight line passing through the onloading position, bonding position and offloading position of each substrate holding device.

9. The bonding apparatus as claimed in claim 1, wherein the first and second substrate holding devices are operative to move along respective first and second cyclical working paths, each complete cyclical working path being in the shape of a quadrilateral.

10. A bonding apparatus for conducting bonding on substrates, the bonding apparatus comprising:
    a first substrate holding device for clamping a first substrate during bonding and a second substrate holding device for clamping a second substrate during bonding, each substrate holding device being operative to move sequentially between its respective onloading position for receiving substrates, bonding position whereat substrates are bonded and offloading position whereat bonded substrates are removed from the substrate holding device;

a first actuator operative to drive the first substrate holding device along a first feeding path from its on loading position to its bonding position and from its offloading position to its onloading position along a first return path; and a second actuator operative to drive the second substrate holding device along a second feeding path from its onloading position to its bonding position and from its offloading position to its onloading position along a second return path; and wherein the first and second substrate holding devices are operative to move along respective first and second cyclical working paths, each complete cyclical working path being in the shape of a quadrilateral; and the first cyclical working path mirrors the second cyclical working path about the bonding position.

11. The bonding apparatus as claimed in claim 9, wherein the first and second cyclical working paths lie on horizontal planes.

12. The bonding apparatus as claimed in claim 9, wherein the first and second cyclical working paths lie on vertical planes.

13. The bonding apparatus as claimed in claim 12, wherein the feeding path and return path of each substrate holding device are at different heights.

14. The bonding apparatus as claimed in claim 1, further comprising a bonding tool comprising a die bonder which is operative to bond semiconductor dice to the substrates at the bonding position.

15. The bonding apparatus as claimed in claim 1, wherein the substrate holding devices are configured to clamp the substrates in a vertical orientation.

16. The bonding apparatus as claimed in claim 1, further comprising a first indexing device coupled to the first substrate holding device and a second indexing device coupled to the second substrate holding device, the first indexing device being movable independently of the second indexing device.

17. The bonding apparatus as claimed in claim 16, wherein each indexing device further includes multiple positioning tables which are operative to position each substrate holding device in directions which are orthogonal to its feeding path.

18. The bonding apparatus as claimed in claim 1, wherein the first and second substrate holding devices are configured to transfer substrates to the bonding positions of the first and second substrate holding devices for bonding alternately.

19. The bonding apparatus as claimed in claim 1, wherein the first return path is spaced from the first feeding path and the second return path is spaced from the second feeding path.

20. The bonding apparatus as claimed in claim 1, wherein the feeding path and return path of each substrate holding device are at different heights.

* * * * *